United States Patent [19]

Yagura et al.

[11] Patent Number: 5,719,415
[45] Date of Patent: Feb. 17, 1998

[54] HETERO-JUNCTION BIPOLAR TRANSISTOR

[75] Inventors: Motoji Yagura; John Kevin Twynam; Hiroya Sato, all of Tenri; Toshiaki Kinosada, Izumi; Koken Yoshikawa, Ikoma, all of Japan

[73] Assignee: Sharp Kabushiki Kaisha, Osaka, Japan

[21] Appl. No.: 615,430

[22] Filed: Mar. 14, 1996

[30] Foreign Application Priority Data

Mar. 14, 1995 [JP] Japan .................................. 7-054733

[51] Int. Cl.$^6$ ................................................. H01L 31/0328
[52] U.S. Cl. ........................... 257/191; 257/197; 257/198
[58] Field of Search ................................. 257/191, 197, 257/198

[56] References Cited

FOREIGN PATENT DOCUMENTS

| 4-286126 | 10/1992 | Japan | 257/197 |
|---|---|---|---|
| 6-244195 | 9/1994 | Japan | 257/197 |

Primary Examiner—Minh-Loan Tran
Attorney, Agent, or Firm—David G. Conlin; George W. Neuner

[57] ABSTRACT

A hetero-junction bipolar transistor includes: a substrate; a first conductive type collector layer disposed on the substrate; a second conductive type base layer having an external base region; and a first conductive type emitter layer having a bandgap larger than the bandgap of the base layer disposed in this order, wherein the emitter layer includes a first emitter layer, an etching stop layer, and a second emitter layer disposed in this order starting from the substrate side; a base electrode is formed on the etching stop layer or the first emitter layer disposed on the external base region; a region of the first emitter layer on the base layer has a thickness such that the region is substantially depleted at all voltages applied when the transistor is normally operated; the second emitter layer has an electron affinity equal to or smaller than an electron affinity of the first emitter layer; and the etching stop layer has an electron affinity larger than the electron affinity of the first emitter layer, and has a thickness of approximately 3 nm.

10 Claims, 3 Drawing Sheets

HETERO-JUNCTION BIPOLAR TRANSISTOR

BACKGROUND OF THE INVENTION

1. Field of the Invention

The present invention relates to hetero-junction bipolar transistors (hereinafter, referred to as HBTs) which are suitable for use in a high speed integrated circuit, and the like, and a method for fabricating the same.

2. Description of the Related Art

In recent years, electronic devices using compound semiconductors with high electron mobility have been increasingly developed. Particularly, HBTs are expected to be utilized in a high speed integrated circuit because a high current amplification ratio can be obtained. In order to incorporate HBTs into a large scale integrated circuit, it is important to reduce the device dimension of the HBTs by a constant ratio. Conventionally, an emitter area has been used to determine the device size of HBTs.

However, no method for fabricating HBTs having small emitter areas and large current gain with excellent reproducibility has been developed. One of the main reasons for this is that, for example, in GaAs or AlGaAs type HBTs, the recombination rate between holes and electrons at the surface (surface recombination rate) of GaAs is high. When HBTs have a small emitter area, in a GaAs external base region, a surface recombination current forms a large proportion with respect to a total base current. As a result, a current gain of the transistor is reduced.

To solve the above-mentioned problems, it is required to form a high quality passivation film (protective film) on an external base region. In order to form the high quality protective film, an AlGaAs emitter layer on the external base is retained as a thin film which is thin enough to be depleted. The method thereof is disclosed in Japanese Laid-Open Patent Publication No. 4-286126.

In this method, an AlGaAs emitter layer is grown to have a thickness required to be a protective film on the external base. Next, a semiconductor layer containing In is grown thereon. Subsequently, an AlGaAs emitter layer is further grown on the semiconductor layer, and a GaAs contact layer is grown thereon. In this epitaxial structure, when the contact layer and the emitter layer are removed by dry-etching performed using a $Cl_2$ gas, the semiconductor layer containing In is not etched and serves as an etching stop layer. As a result, an emitter layer having a thickness required to serve as a protective film can be retained on the external base.

However, the conventional HBT having the above-mentioned epitaxial structure has problems as described below:

(1) The semiconductor layers containing In such as an $In_yAl_{1-y}As$ layer generates a lattice mismatch with respect to GaAs or AlGaAs layers.

(2) The band gap Eg of $In_yAl_{1-y}As$ (y=0.15) is approximately 2.0 eV, which is larger than that of $Al_{0.3}Ga_{0.7}As$ generally used as an emitter layer (1.7981 eV). Therefore, $In_yAl_{1-y}As$ (y=0.15) layer serves as a barrier against electrons, so that the emitter resistance is increased. As a result, electrons are stored on the $In_yAl_{1-y}As/AlGaAs$ interface and recombined via an interface level, so that a problem occurs that a current amplification ratio $H_{FE}$ is decreased.

(3) It is required to increase the mole fraction y so as to decrease a bandgap Eg of the $In_yAl_{1-y}As$ layer. However, if the mole fraction y of In is increased, a problem occurs that crystal distortion due to the lattice mismatch becomes high.

SUMMARY OF THE INVENTION

The hetero-junction bipolar transistor of this invention includes: a substrate; a first conductive type collector layer disposed on the substrate; a second conductive type base layer having an external base region; and a first conductive type emitter layer having a bandgap larger than the bandgap of the base layer disposed in this order, wherein the emitter layer includes a first emitter layer, an etching stop layer, and a second emitter layer disposed in this order starting from the substrate side; wherein, a base electrode is formed on the etching stop layer or the first emitter layer disposed on the external base region; a region of the first emitter layer on the base layer has a thickness such that the region is substantially depleted at all voltages applied when the transistor is normally operated; the second emitter layer has an electron affinity equal to or smaller than an electron affinity of the first emitter layer; and the etching stop layer has an electron affinity larger than the electron affinity of the first emitter layer, and has a thickness of approximately 3 nm.

In one embodiment of the invention, the first emitter layer is composed of AlGaAs or InGaP.

In another embodiment of the invention, the base electrode includes a Pt layer, a Ti layer, a Pt layer, and an Au layer in this order starting from the substrate side, and the thickness of the Pt layer on the substrate side is about 12.5 nm or more.

In still another embodiment of the invention, the etching stop layer is lattice-matched with the first emitter layer and the second emitter layer.

In still another embodiment of the invention, the first emitter layer and the second emitter layer are composed of AlGaAs, and the etching stop layer is composed of GaAs.

According to another aspect of the invention, a method for fabricating a hetero-junction bipolar transistor includes: a substrate; a first conductive type collector layer disposed on the substrate; a second conductive type base layer having an external base region; and a first conductive type emitter layer having a bandgap larger than the bandgap of the base layer in this order, the method comprising the steps of: forming a first emitter layer on the base layer so that a region of the first emitter layer positioned on the external base region is substantially depleted at all voltages applied when the transistor is normally operated; forming an etching stop layer on the first emitter layer so as to have an electron affinity larger than an electron affinity of the first emitter layer, and having a thickness of approximately 3 nm or more; forming a second emitter layer on the etching stop layer so as to have an electron affinity equal to or smaller than the electron affinity of the first emitter layer; exposing the first emitter layer or the etching stop layer positioned on the external base region by selectively etching the second emitter layer and the etching stop layer; and forming a base electrode on the exposed first emitter layer or the etching stop layer.

In one embodiment of the invention, the first emitter layer is formed by using AlGaAs or InGaP.

In another embodiment of the invention, the step of forming the base electrode is a step of forming an ohmic contact between the base layer and the base electrode by forming a base electrode including a Pt layer, a Ti layer, Pt layer and an Au layer on the exposed first emitter layer or the etching stop layer, and by thermally diffusing Pt.

In still another embodiment of the invention, the etching stop layer is epitaxially grown on the first emitter layer, and the etching stop layer is lattice-matched with the first emitter layer.

In still another embodiment of the invention, the first emitter layer and the second emitter layer are formed by using AlGaAs, and the etching stop layer is formed by using GaAs.

In the present invention, an etching stop layer is formed between a first emitter layer and a second emitter layer. Accordingly, the layers above from the second emitter layer or the layers above from the etching stop layers on the external base region are removed by etching, so that the thin-film emitter layer (i.e., the first emitter layer) which will serve as a protective film can be easily retained on the external base. In the case where the etching stop layer on the external base region is removed by etching, there is an advantage that the surface recombination is small as compared with the case where the etching stop layer is not removed by etching. In the case where the etching stop layer on the external base region is not removed by etching, where the surface recombination is large as compared with the case where the etching stop layer is removed by etching, there is an advantage that the etching process is simplified.

Moreover, for example, when AlGaAs is used for the first emitter layer and the second emitter layer, and GaAs is used for the etching stop layer, crystal distortion due to the difference of the lattice constant is not generated.

Furthermore, since the thickness of the etching stop layer is set to approximately 3 nm or more, a selective etching can be sufficiently performed. Since the etching stop layer is thin enough to obtain the quantum well effect, the difference $\Delta Ec$ between the highest quantized level formed in the etching stop layer and the conduction band of the first emitter layer becomes smaller as compared with the case where the quantum well effect is not generated. Accordingly, the barrier effect between the emitter and the base can be reduced, so that the emitter resistance can be decreased.

As described above, the structure having no crystal distortion can be obtained, and the emitter resistance can be decreased. As a result, deterioration of a current amplification ratio $H_{FE}$ due to the increase in recombination rate can be prevented.

Since the second emitter layer has an electron affinity equal to or smaller than that of the first emitter layer, there is an advantage that the flow of holes can be prevented.

When InGaP is used for the first emitter layer, the recombination current can be further reduced as compared with the case where AlGaAs is used. In addition, the difference $\Delta Ec$ between the conduction bands of the base layer and the first emitter layer becomes smaller as compared with the case where AlGaAs is used. Furthermore, the difference $\Delta Ec$ between the highest quantized level formed in the etching stop layer and the conduction band of the first emitter layer becomes smaller as compared with the case where AlGaAs is used.

When AlGaAs or InGaP is used as the first emitter layer, by forming a base electrode composed of a Pt layer, a Ti layer, a Pt layer, and an Au layer on the exposed etching stop layer or the first emitter layer so as to diffusing Pt, an ohmic contact with the base layer is formed. Pt used as a material for the base electrode diffuses approximately twice as thick as the layer due to the solid-phase reaction and becomes thermally stable, so that the diffusion thereof can be easily controlled as compared with AuBe. Moreover, the thickness of the Pt layer on the substrate side is determined in view of the variation in the thicknesses of the first emitter layer and the base layer, and is preferably set to about 12.5 nm or more.

Thus, the invention described herein makes possible the advantages of providing a hetero-junction bipolar transistor in which a thin film emitter layer serving as a protective film can be easily retained on an external base; crystal distortion due to a lattice mismatch can be prevented; and a resistance between an emitter and a base is decreased so as to reduce the recombination, and a method for fabricating the same.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanied drawings.

Example 1

Figure 1:
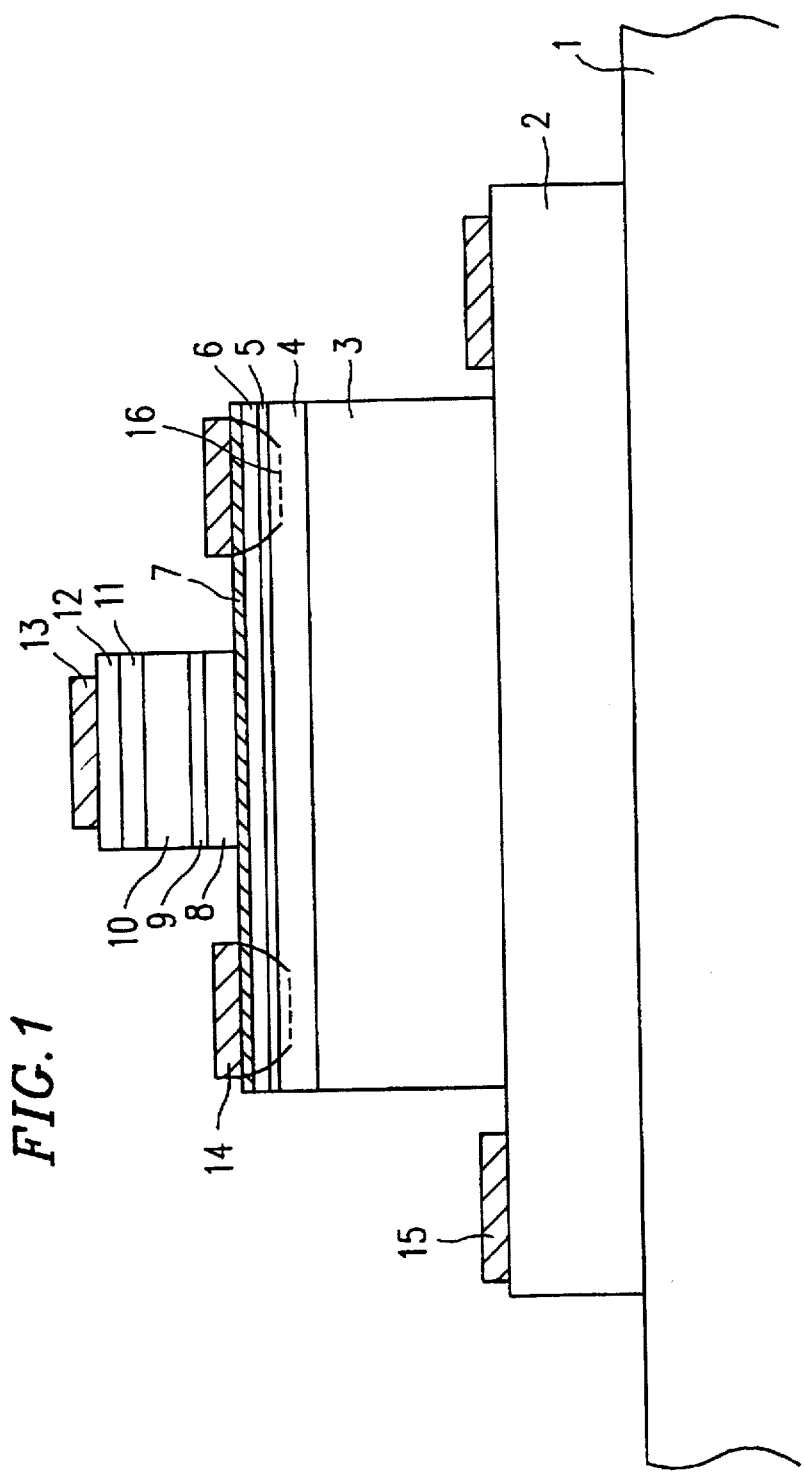
FIG. 1 is a cross-sectional view showing an HBT according to one example of the present invention.

FIG. 1 is a cross-sectional view showing a GaAs/AlGaAs type HBT according to one example of the present invention.

The HBT of the present invention is constituted by forming a subcollector layer 2 ($n^+$-GaAs layer, thickness:500 nm, impurity concentration:5E18 $cm^{-3}$) on a semi-insulating GaAs substrate 1. On the subcollector 2, a collector layer 3 (n-GaAs layer, thickness:700 nm, impurity concentration:2E16 $cm^{-3}$), a base layer 4 ($p^+$-GaAs layer, thickness:80 nm, impurity concentration:2E19 $cm^{-3}$), a graded layer 5 (n-$Al_xGa_{1-x}$As layer, x=0→0.3, thickness:20 nm, impurity concentration:5E17 $cm^{-3}$), a first emitter layer 6 (n-$Al_{0.3}Ga_{0.7}$As layer, thickness:20 nm, impurity concentration:5E17$cm^{-3}$), and an etching stop layer 7 ($n^+$-GaAs layer, thickness:5 nm, impurity concentration:5E18 $cm^{-3}$), are formed in this order.

On the etching stop layer 7, a second emitter layer 8 (n-$Al_{0.3}Ga_{0.7}$As layer, thickness:100 nm, impurity concentration:5E17 $cm^{-3}$), a graded layer 9 (n-$Al_xGa_{1-x}$As layer, x=0.3→0, thickness:20 nm, impurity concentration:5E17 $cm^{-3}$), a contact layer 10 ($n^+$-GaAs layer, thickness:100 nm, impurity concentration:5E18 $cm^{-3}$), a graded layer 11 ($n^+$-$In_yGa_{1-y}$As layer, y=0→0.3, thickness:50 nm, impurity concentration:2E19 $cm^{-3}$), and a cap layer 12 ($n^+$- $In_{0.5}Ga_{0.5}$As layer, thickness:50 nm, impurity concentration:2E19 $cm^{-3}$), are formed in this order.

The collector layer 3, the base layer 4, the graded layer 5, the first emitter layer 6, and the etching stop layer 7 are subjected to mesa etching so that the subcollector layer 2 is exposed. The layers above from the second emitter layer 8 (i.e., the second emitter layer 8, the graded layer 9, the contact layer 10, the graded layer 11, and the cap layer 12) are subjected to mesa etching in such a manner that the etching stop layer 7 is exposed. On the exposed subcollector layer 2, a collector electrode 15 composed of an AuGe layer, an Ni layer, and an Au layer is formed. On the etching stop layer 7, a base electrode 14 composed of a Pt layer, a Ti layer, a Pt layer, and an Au layer disposed in this order starting from the substrate side is formed. On the cap layer 12, an emitter electrode 13 composed of a Ti layer, a Pt layer, and an Au layer deposited in this order starting from the substrate side is formed.

A process for fabricating this HBT is as follows: First, on the semi-insulating GaAs substrate 1, the subcollector layer 2, the collector layer 3, the base layer 4, the graded layer 5, the first emitter layer 6, the etching stop layer 7, the second emitter layer 8, the graded layer 9, the contact layer 10, the graded layer 11, and the cap layer 12 are sequentially formed by a method such as a molecular beam epitaxy (MBE) method.

Next, a mask for emitter mesa etching is formed on the substrate in the above-mentioned state by using a photoresist by a photolithography method. After that, the emitter layer is subjected to mesa etching by the following steps: First, the cap layer 12, the graded layer 11, the contact layer 10, the graded layer 9, and a portion of the second emitter layer 8 are etched by using phosphoric acid etchant (a mixed solution of $H_3PO_4:H_2O_2:H_2O$). Next, the second emitter layer 8 is subjected to a selective etching by using hydrofluoric acid (49% aqueous solution). In this selective etching, since the ratio of the etching rate for $Al_{0.3}Ga_{0.7}As$ to that for GaAs by using hydrofluoric acid (a selection ratio) is approximately 100, the etching is stopped at the etching stop layer 7 and the etching is not performed any more. In this manner, an emitter mesa is formed while retaining the graded layer 5, the first emitter layer 6, and the etching stop layer 7 which serve as protective films on the external base region 16.

Next, a mask for base mesa etching is formed on the substrate in the above-mentioned state by using a photoresist. The periphery of the base layer 4 is mesa-etched until the subcollector layer 2 is exposed, and then the resist mask is removed.

Then, the region, in which the emitter electrode 13 is formed, is exposed by a photolithography method. By using a resist pattern as a mask, a Ti layer, a Pt layer, an Au layer are deposited, and then, the resist mask is dissolved and removed (lift-off method). Accordingly, the emitter electrode 13 is formed on the cap layer 12. Subsequently, by the same lift-off method as described above, the collector electrode 15 composed of an AuGe layer, an Ni layer, and an Au layer is deposited on the exposed subcollector layer 2, and the base electrode 14 composed of a Pt layer, a Ti layer, a Pt layer, and an Au layer is deposited on the etching stop layer 7. The ohmic contacts of the base electrode 14 and the collector electrode 15 are simultaneously formed by performing a thermal processing for 1 minute at a temperature of about 390° C. In this case, at the base electrode 14, Pt is diffused into the etching stop layer 7, the emitter layer 6, and the graded layer 5, so that the ohmic contact with low resistance is formed.

Then, a mask for collector mesa etching is formed by using resist, and by etching the subcollector layer 2, a collector mesa is formed, and a device isolation is performed. Finally, the resist mask is removed, and as a result, the HBT such as shown in FIG. 1 is completed.

Since the thus-obtained HBT includes the etching stop layer 7 composed of GaAs, crystal distortion caused by the difference in lattice constant can be prevented. Moreover, since the thickness of the etching stop layer 7 is 3 nm or more, the selective etching can be sufficiently performed, and a high quality protective film can be formed on the GaAs external base region 16 with excellent reproducibility. In addition, the thickness of the etching stop layer 7 is about 5 nm which is thin enough to obtain a quantum well effect. The difference ΔEc between the highest quantized level formed in the etching stop layer 7 and the conduction band of the first emitter layer 6 is 158 meV. This value is smaller as compared with the case where the quantum effect is not generated (i.e., ΔEc is 239.4 meV). As a result, the emitter resistance can be decreased.

As described above, the structure with no crystal distortion can be obtained and the emitter resistance can be decreased, so that the deterioration of the current amplification ratio $H_{FE}$ caused by the increase in the recombination rate is prevented, thereby making it possible to obtain the current amplification ratio $H_{FE}$ of about 100 or more which is not inferior to that obtained in the conventional HBTs.

In the GaAs/AlGaAs type HBT as described in this example, in order to retain the first emitter layer on the external base as a protective film so as to obtain the effect of suppressing the surface recombination current (an edgining effect), it is required to design the first emitter layer to have a thickness equal to or less than that of a depletion layer. When $Al_{0.3}Ga_{0.7}As$ doped in a concentration of approximately 5E17 $cm^{-3}$, as commonly used, is used as the first emitter layer, the thickness thereof is preferably in a range of about 20 to about 60 nm.

It is required to design the second emitter layer to have a thickness equal to or more than that of the depletion layer, in order to prevent the flow of holes from the base to the emitter. Also, in order to maintain the quantum effect, the second emitter layer is required to be thick. Accordingly, the thickness is preferably about 40 nm or more.

Example 2

In this example, an InGaP layer is used as an emitter layer, and an HBT having an epitaxial structure as shown in Table 1 was fabricated. In Table 1, components designated by the reference numerals identical to those in FIG. 1 have the same function.

TABLE 1

| Layer | Thickness (nm) | Material | Composition | Doping ($cm^{-3}$) |
| --- | --- | --- | --- | --- |
| Cap layer 12 | 50 | n $In_yGa_{1-y}As$ | y = 0.5 | 2E19 |
| Graded layer 11 | 50 | n $In_yGa_{1-y}As$ | y = 0→0.5 | 2E19 |
| Contact layer 10 | 100 | n GaAs | | 5E18 |
| 2nd emitter layer 8 | 40 | n $In_xGa_{1-x}P$ | x = 0.49 | 5E18 |
| Etching stop layer 7 | 5 | n GaAs | | 5E17 |
| 1st emitter layer 6 | 40 | n $In_xGa_{1-x}P$ | x = 0.49 | 5E17 |
| Base layer 4 | 50 | p GaAs | | 5E19 |
| Collector layer 3 | 500 | n GaAs | | 5E16 |
| Subcollector layer 2 | 500 | n GaAs | | 5E18 |

A process for fabricating this HBT is the same as that described in Example 1, except for an emitter mesa etching process. Hereinafter, the emitter mesa etching process of this example will be described.

First, the cap layer 12, the graded layer 11, the contact layer 10, the graded layer 9, and a portion (up to a halfway) of the second emitter layer 8 are etched by using phosphoric acid etchant (a mixed solution of $H_3PO_4: H_2O_2:H_2O$). Next, the second emitter layer 8 is subjected to a selective etching by using $HCl:H_3PO_4$ type etchant. In this selective etching, since the ratio of the etching rate for $In_{0.49}Ga_{0.51}P$ to that for GaAs by using the $HCl:H_3PO_4$ type etchant (a selection ratio) is about 1000:1 or more, the etching is stopped at the etching stop layer 7. In this manner, an emitter mesa is formed while retaining the graded layer 5, the first emitter layer 6, and the etching stop layer 7.

Since the HBT of this example includes InGaP layer as a first emitter layer 6, the recombination current can be further decreased as compared with the case where AlGaAs is used. In addition, the difference ΔEc between the conduction bands of the base layer 4 and the first emitter layer 6 becomes smaller as compared with the case where AlGaAs is used. Moreover, the difference ΔEc between the highest quantized level formed in the etching stop layer and the conduction band of the first emitter layer also becomes smaller as compared with the case where AlGaAs is used. In this example, it was possible to obtain the current amplification ratio $H_{FE}$ of about 110.

Example 3

Figure 2:
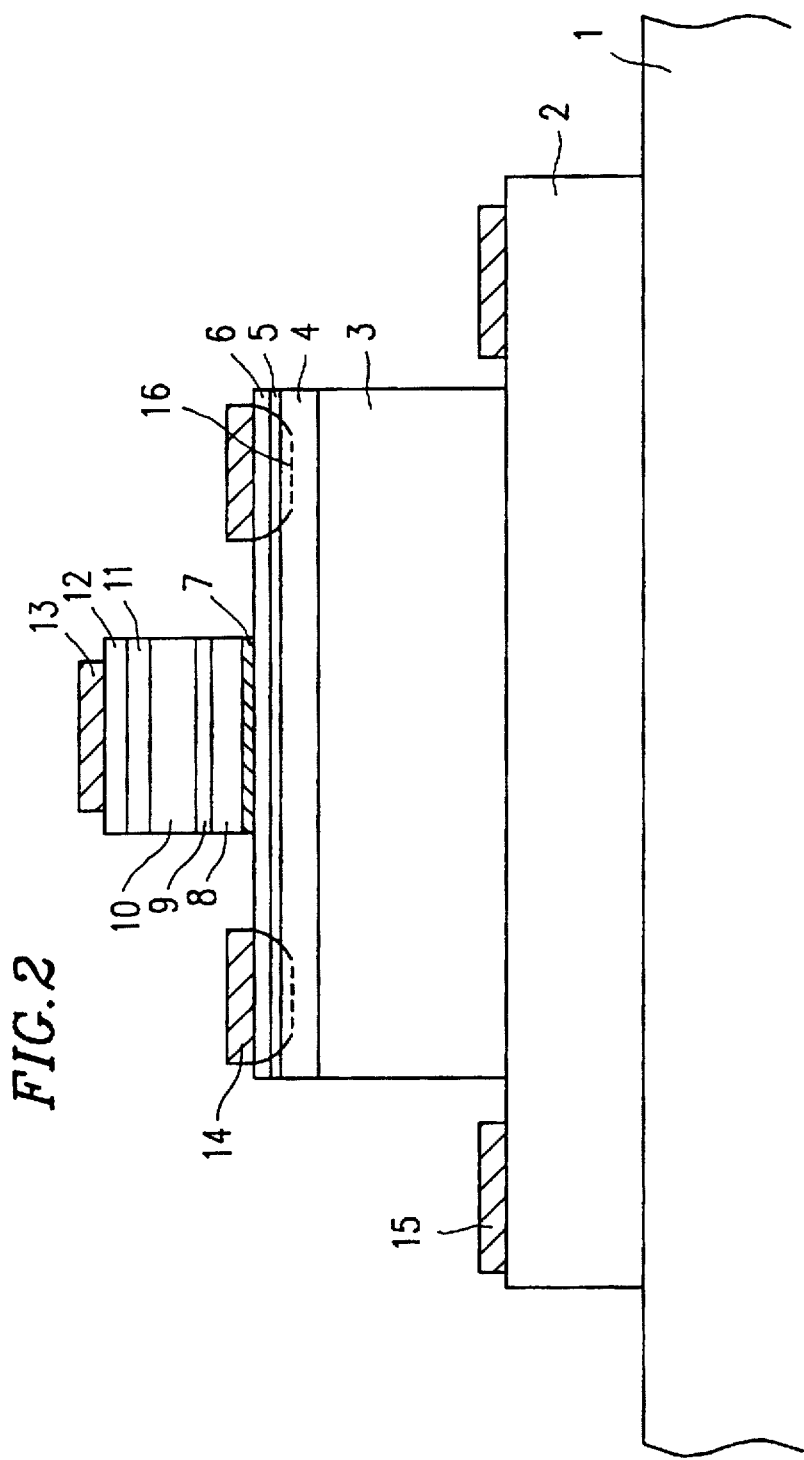
FIG. 2 is a cross-sectional view showing an HBT according to Example 3 of the present invention.

FIG. 2 is a cross-sectional view showing a GaAs/AlGaAs type HBT of Example 3. In this HBT, the layers above from the etching stop layer 7, i.e., the layer 7, the second emitter layer 8, the graded layer 9, the contact layer 10, the graded layer 11, and the cap layer 12 are subjected to mesa etching in such a manner that the etching stop layer 7 is exposed. On the exposed first emitter layer 6, a base electrode 14 composed of a Pt layer, a Ti layer, a Pt layer, and an Au layer is formed. The other configurations are the same as those described in Example 1.

A process for fabricating this HBT is as follows: First, on a semi-insulating GaAs substrate 1, a subcollector layer 2, a collector layer 3, a base layer 4, a graded layer 5, a first emitter layer 6, a etching stop layer 7, a second emitter layer 8, a graded layer 9, a contact layer 10, a graded layer 11, and a cap layer 12 are sequentially formed by a method such as a molecular beam epitaxy (MBE) method.

Next, a mask for emitter mesa etching is formed on the substrate in the above-mentioned state by using a photoresist by a photolithography method. After that, the emitter layer is subjected to mesa etching by the following steps: First, the cap layer 12, the graded layer 11, the contact layer 10, the graded layer 9, and a portion (up to a halfway) of the second emitter layer 8 are etched by using phosphoric acid etchant (a mixed solution of $H_3PO_4:H_2O_2:H_2O$). Next, the second emitter layer 8 is subjected to a selective etching by using hydrofluoric acid (49% aqueous solution). In this selective etching, since the ratio of the etching rate for $Al_{0.3}Ga_{0.7}As$ to that of GaAs by using hydrofluoric acid (a selection ratio) is approximately 100, the etching is stopped at the etching stop layer 7. Subsequently, the etching stop layer 7 is removed by using phosphoric acid etchant (a mixed solution of $H_3PO_4:H_2O_2:H_2O$). In this etching, the etching stop layer 7 is thin enough to easily control the etching. In this manner, an emitter mesa is formed while retaining the graded layer 5, the first emitter layer 6, and the etching stop layer 7 which serve as protective films on the external base region 16.

Next, base mesa etching is performed in the same manner as that described in Example 1.

Then, the emitter electrode 13 is formed on the cap layer 12 in the same manner as that described in Example 1. Moreover, the collector electrode 15 composed of an AuGe layer, an Ni layer, and an Au layer is deposited on the exposed subcollector layer 2, and the base electrode 14 composed of a Pt layer, a Ti layer, a Pt layer, and an Au layer is deposited on the first emitter layer 6. The ohmic contacts of the base electrode 14 and the collector electrode 15 are simultaneously formed by performing a thermal processing for 1 minute at a temperature of about 390° C. In this case, at the base electrode 14, Pt diffuses into the emitter layer 6 and the graded layer 5, so that the ohmic contact with low resistance is formed.

Then, a device isolation is performed by collector mesa etching in the same manner as that described in Example 1, and the resist mask is removed. As a result, the HBT such as shown in FIG. 2 is completed.

In the HBT according to this example it was possible to obtain the current amplification ratio $H_{FE}$ of about 100 or more which is not inferior to that obtained in the conventional HBTs.

Example 4

In this example, an experiment for determining the thickness of etching stop layer has been conducted.

Figure 3:
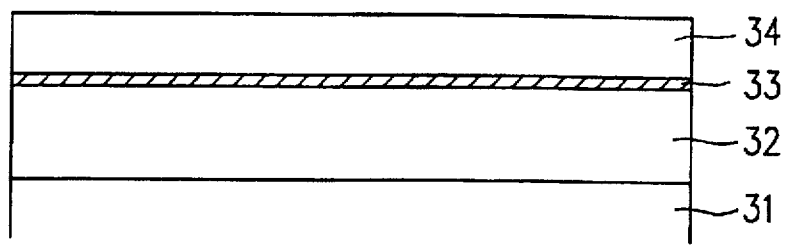
FIG. 3 is a cross-sectional view for illustrating Example 4 of the present invention.

First, as shown in FIG. 3, a first emitter layer 32 composed of n-$Al_{0.3}Ga_{0.7}As$ (thickness:200 nm, impurity concentration:5E17 cm$^{-3}$), an etching stop layer 33 composed of n$^+$-GaAs (thickness:0 nm, 1 nm, 2 nm, 3 nm, 4 nm, and 5 nm, impurity concentration:5E18 cm$^{-3}$), and a second emitter layer 34 composed of n-$Al_{0.3}Ga_{0.7}As$ (thickness:100 nm, impurity concentration:5E17 cm$^{-3}$) are sequentially deposited on a semi-insulating GaAs substrate 31 by a method such as a molecular beam epitaxy (MBE) method.

Next, the second emitter layer 34 composed of n-$Al_{0.3}Ga_{0.7}As$ is etched for 4 minutes by using hydrofluoric acid (49% aqueous solution), and the etching steps are measured.

Figure 4:
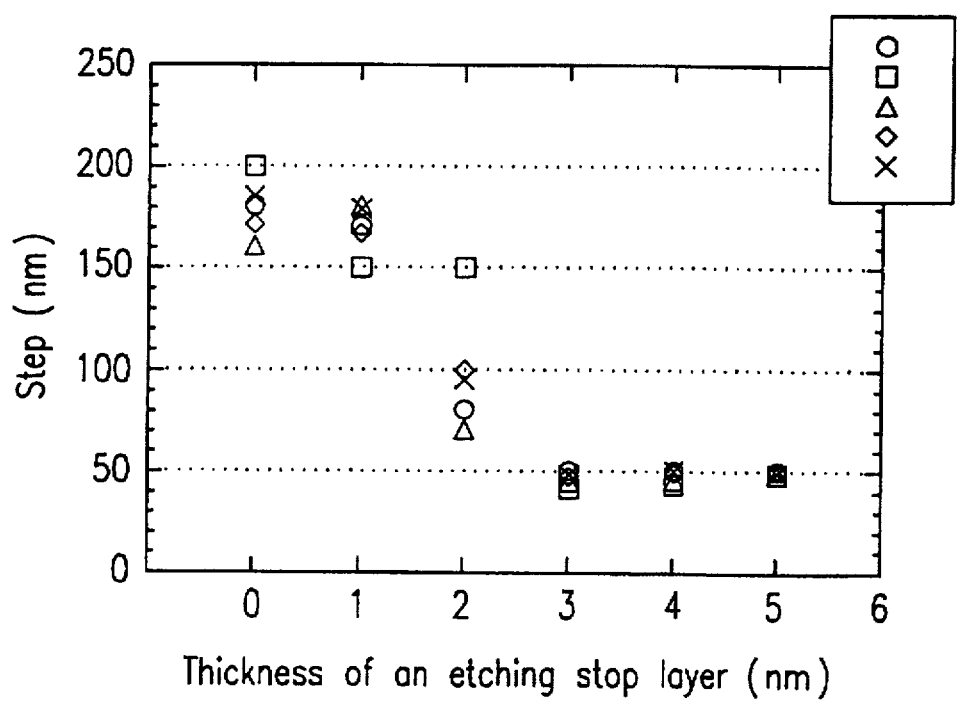
FIG. 4 is a graph showing a relationship between the thickness of an etching stop layer and an etching step.

FIG. 4 shows a relationship between the thickness of the etching stop layer 33 and the etching step. In FIG. 4, it is recognized that the etching stop layer 33 (n$^+$-GaAs layer) does not serve as an etching stop layer when the thickness thereof is set to 0 nm, 1 nm, and 2 nm. In accordance with the result of this experiment, in the present invention, the etching stop layer 33 was set to about 3 nm or more.

In this example, if the second emitter layer has an electron affinity smaller than that of the first emitter layer, the quantum effect is increased and the emitter resistance is decreased.

In this example, a GaAs layer is used as an etching stop layer. However, other layers such as an $Al_xGa_{1-x}As$ layer can be used as far as its lattice is matched with a base layer and a emitter layer. Moreover, layers such as a GaAs layer, an InGaAs layer, an AlGaAs layer, a GaSb layer, an SiGe layer, an Si layer, and a Ge layer which are doped can be used as a base layer, and layers such as an AlGaAs layer, an AlGaSb layer, an InAlAs layer, a GaAsP layer, an Si layer, a GaP layer, and a GaAs layer which are doped can be used as a first emitter layer. Furthermore, other mole fraction ratios can be employed as well as that described above. An etchant for selective etching can be appropriately selected based on the materials of the etching stop layer and the emitter layer.

As a base electrode material, a collector electrode material, and an emitter electrode material, other materials can be used as well as those described above. When Pt is used as the base electrode material, Pt diffuses twice as thick as the thickness of the layer due to the solid-phase reaction with GaAs, so that the diffusion can be controlled more easily as compared with the case of where AuBe is used. In this case, the thickness of the Pt layer (as described above, in the case of a Pt layer/Ti layer/Pt layer/Au layer, the Pt layer on the substrate side) is set in view of the variation in the thicknesses of the emitter layer and the base layer. For example, when the thickness of the first emitter layer is about 20 nm and the thickness of the base layer is about 80 nm, the thickness of the Pt layer is preferably in a range of about 12.5 nm to about 40 nm.

As described above, according to the present invention, the etching stop layer is formed between the first and the second emitter layers, so that the layers above from the second emitter layer or the layers above from the etching stop layers on the external base region are removed by etching, whereby a thin-film emitter layer (the first emitter layer) which serves as a protective film can be easily retained on the external base.

Moreover, a crystal distortion caused by a lattice mismatch is prevented and the emitter resistance is kept low so as to reduce the recombination rate, whereby the deterioration of a current amplification ratio $H_{FE}$ caused by the increase in the recombination can be prevented.

Furthermore, since the thickness of the etching stop layer is set to about 3 nm or more, the selective etching can be sufficiently performed. In addition, since the etching stop layer is thin enough to obtain the quantum well effect, the barrier effect of the emitter can be reduced.

When an InGaP layer is used as a first emitter layer, a recombination current can be further reduced as compared with the case where an AlGaAs layer is used. In this case, the difference $\Delta Ec$ between the conduction bands of the base layer and the first emitter layer becomes smaller as compared with the case where an AlGaAs layer is used. Moreover, the difference $\Delta Ec$ between the highest quantized level formed in the etching stop layer and the conduction band of the first emitter layer becomes smaller as compared with the case where an AlGaAs layer is used.

When Pt is used as the base electrode material, since Pt diffuses twice as thick as the thickness of the layer due to the solid-phase reaction with GaAs, the diffusion can be controlled more easily as compared with the case where AuBe is used.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A hetero-junction bipolar transistor comprising: a substrate; a first conductive type collector layer disposed on the substrate; a second conductive type base layer having an external base region; and a first conductive type emitter layer having a bandgap larger than the bandgap of the base layer disposed in this order, wherein the emitter layer includes a first emitter layer, an etching stop layer, and a second emitter layer disposed in this order starting from the substrate side;

a base electrode is formed on the etching stop layer disposed on the external base region;

a region of the first emitter layer on the base layer has a thickness such that the region is substantially depleted at all voltages applied when the transistor is normally operated;

the second emitter layer has an electron affinity equal to or smaller than an electron affinity of the first emitter layer; and the etching stop layer has an electron affinity larger than the electron affinity of the first emitter layer, and has a thickness of approximately 3 nm.

2. A hereto-junction bipolar transistor according to claim 1, wherein the first emitter layer is composed of AlgaAs or InGaP.

3. A hetero-junction bipolar transistor according to claim 2, wherein the base electrode includes a Pt layer, a Ti layer, a Pt layer, and an Au layer in this order starting from the substrate side, and the thickness of the Pt layer on the substrate side is about 12.5 nm or more.

4. A hereto-junction bipolar transistor according to claim 1, wherein the etching stop layer is lattice-matched with the first emitter layer and the second emitter layer.

5. A hetero-junction bipolar transistor according to claim 4, wherein the first emitter layer and the second emitter layer are composed of AlGaAs, and the etching stop layer is composed of GaAs.

6. A hetero-junction bipolar transistor comprising: a substrate; a first conductive type collector layer disposed on the substrate; a second conductive type base layer having an external base region; and a first conductive type emitter layer having a bandgap larger than the bandgap of the base layer disposed in this order, wherein the emitter layer includes a first emitter layer, an etching stop layer, and a second emitter layer disposed in this order starting from the substrate side;

a base electrode is formed on the first emitter layer disposed on the external base region;

a region of the first emitter layer on the base layer has a thickness such that the region is substantially depleted at all voltages applied when the transistor is normally operated;

the second emitter layer has an electron affinity equal to or smaller than an electron affinity of the first emitter layer; and the etching stop has an electron affinity larger than the electron affinity of the first emitter layer, and has a thickness of approximately 3 nm.

7. A hetero-junction bipolar transistor according to claim 6, wherein the first emitter layer is composed of AlGaAs or InGaP.

8. A hetero-junction bipolar transistor according to claim 7, wherein the base electrode includes a Pt layer, a Ti layer, a Pt layer, and an Au layer in this order starting from the substrate side, and the thickness of the Pt layer on the substrate side is about 12.5 nm or more.

9. A hetero-junction bipolar transistor according to claim 6, wherein the etching stop layer is lattice-matched with the first emitter layer and the second emitter layer.

10. A hetero-junction bipolar transistor according to claim 9, wherein the first emitter layer and the second emitter layer are composed of AlGaAs, and the etching stop layer is composed of GaAs.

* * * * *